United States Patent
Son et al.

(10) Patent No.: US 7,816,784 B2
(45) Date of Patent: Oct. 19, 2010

(54) POWER QUAD FLAT NO-LEAD SEMICONDUCTOR DIE PACKAGES WITH ISOLATED HEAT SINK FOR HIGH-VOLTAGE, HIGH-POWER APPLICATIONS, SYSTEMS USING THE SAME, AND METHODS OF MAKING THE SAME

(75) Inventors: Joon-Seo Son, Seoul (KR); Romel N. Manatad, Mandaue (PH); Armand Vincent Jereza, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/337,513

(22) Filed: Dec. 17, 2008

(65) Prior Publication Data

US 2010/0148328 A1   Jun. 17, 2010

(51) Int. Cl.
H01L 23/34 (2006.01)
(52) U.S. Cl. .................. 257/707; 257/675; 438/122
(58) Field of Classification Search .............. 257/706, 257/707, 666, 675; 438/122, 123
See application file for complete search history.

(56) References Cited

U.S. PATENT DOCUMENTS

| | | | |
|---|---|---|---|
| 6,777,800 B2 | 8/2004 | Madrid et al. | |
| 7,022,548 B2 | 4/2006 | Joshi et al. | |
| 7,061,080 B2 | 6/2006 | Jeun et al. | |
| 7,081,666 B2 | 7/2006 | Joshi et al. | |
| 7,208,819 B2 | 10/2007 | Jeun et al. | |
| 7,285,849 B2 | 10/2007 | Cruz et al. | |
| 7,315,077 B2 | 1/2008 | Choi et al. | |
| 7,332,806 B2 | 2/2008 | Joshi et al. | |
| 2004/0207052 A1 | 10/2004 | Joshi et al. | |
| 2006/0284291 A1 | 12/2006 | Joshi et al. | |
| 2007/0114642 A1* | 5/2007 | Hosoyamada et al. | 257/676 |
| 2007/0132091 A1 | 6/2007 | Wu et al. | |
| 2007/0200209 A1* | 8/2007 | Fukuzono | 257/675 |
| 2007/0241431 A1 | 10/2007 | Manatad | |
| 2007/0249092 A1 | 10/2007 | Joshi et al. | |
| 2008/0023807 A1 | 1/2008 | Noquil et al. | |
| 2008/0173991 A1 | 7/2008 | Cruz et al. | |
| 2009/0057855 A1 | 3/2009 | Quinones et al. | |
| 2009/0115037 A1* | 5/2009 | How et al. | 257/675 |
| 2009/0236708 A1* | 9/2009 | Shi et al. | 257/675 |
| 2009/0302444 A1* | 12/2009 | Ueda et al. | 257/675 |

* cited by examiner

*Primary Examiner*—S. V Clark
(74) *Attorney, Agent, or Firm*—Townsend and Townsend and Crew LLP

(57) ABSTRACT

Disclosed are PQFN semiconductor die packages for high-voltage, high-power applications, systems using the packages, and methods of making the packages. An exemplary package comprises a leadframe, a semiconductor die disposed on the leadframe, and a heat sink member disposed on the semiconductor die and the leadframe and integrated into the molding material of the package. The heat sink member has an electrically insulating substrate with a high breakdown voltage, and one or more conductive layers disposed on a first surface of the substrate that electrically interconnect the semiconductor to one or more leads of the leadframe.

24 Claims, 4 Drawing Sheets

POWER QUAD FLAT NO-LEAD SEMICONDUCTOR DIE PACKAGES WITH ISOLATED HEAT SINK FOR HIGH-VOLTAGE, HIGH-POWER APPLICATIONS, SYSTEMS USING THE SAME, AND METHODS OF MAKING THE SAME

CROSS-REFERENCES TO RELATED APPLICATIONS

Not applicable

BACKGROUND OF THE INVENTION

Power semiconductor devices are currently used to switch large amounts of current at moderate voltage levels. They are required to be thermally coupled to relatively large heat sinks, which are bulky and require assembly. Often, there also has to be a layer of electrical insulation between the power device and the heat sink for safety. The layer of electrical insulation may be provided by the package molding, or by a sheet of dielectric material disposed between a metal part of the package (e.g., exposed die paddle) and the heat sink. The first approach has relatively poor thermal conductivity. The second approach makes the assembly of the heat sink more complex.

BRIEF SUMMARY OF THE INVENTION

As part of making their invention, the inventors see a need for a low-cost die package for power semiconductor devices that provides high power dissipation capability, high voltage isolation (e.g., high breakdown strength), and high current electrical interconnections to the die. However, achieving such goals simultaneously has been difficult in the prior art.

Accordingly, a first general exemplary embodiment according to the present invention is directed to a semiconductor die comprising a leadframe, at least one semiconductor die, and heat sink member integrated together. The leadframe has a first surface, a second surface opposite to its first surface, a die attach region, a tab disposed adjacent the die attach region, and at least one lead electrically coupled to the tab. The semiconductor die has a first surface disposed on the die attach region at the first surface of the leadframe and a second surface opposite to its first surface, a first electrode disposed on the die's first surface and electrically coupled to the die attach region, and a second electrode disposed on the die's second surface. The heat sink member is disposed over the second surface of the semiconductor die and the tab of the leadframe. The heat sink member has an electrically insulating substrate with a first surface and a second surface, an electrically conductive layer disposed on the substrate's first surface, and a heat conducting layer disposed on the substrate's second surface. The electrically conductive layer has a first portion electrically coupled to the die's second electrode and a second portion electrically coupled to the leadframe's tab. The exemplary semiconductor die further comprises a body of electrically insulating material disposed between the heat sink member and the leadframe and adhered to the heat sink member and the leadframe.

With this exemplary construction, a robust and compact semiconductor die package for semiconductor power devices can be constructed with high power dissipation capability and excellent voltage isolation for high voltage applications. The electrically conductive layer and the leadframe provide high current connections to the die. The construction also provides dual cooling paths for the device through the top and bottom surfaces of package, and the easy ability of a user to attach an external heat sink to the top surface of the package for additional cooling without the need to use electrically insulating adhesive.

A second general exemplary embodiment according to the present invention is directed to a method of making a semiconductor die. The method comprises assembling a leadframe, at least one semiconductor die, and a heat sink member together. The leadframe has a first surface, a second surface opposite to its first surface, a die attach region, a tab disposed adjacent the die attach region, and at least one lead electrically coupled to the tab. The at least one semiconductor die has a first surface, a second surface opposite to its first surface, a first electrode disposed on the die's first surface, and a second electrode disposed on the die's second surface. The die's first surface is disposed on the leadframe's die attach region with the die's first electrode being electrically coupled to the die attach region by a body of electrically conductive adhesive. The heat sink member has an electrically insulating substrate with a first surface and a second surface, an electrically conductive layer disposed on the substrate's first surface, and a heat conducting layer disposed on the substrate's second surface. The heat sink member is disposed over the second surface of the semiconductor die and the tab of the leadframe with the electrically conductive layer having a first portion electrically coupled to the die's second electrode and a second portion electrically coupled to the leadframe's tab. The exemplary method further comprises disposing a body of electrically insulating material disposed between the heat sink member and the leadframe and adhered to the heat sink member and the leadframe.

The above exemplary embodiments and other embodiments of the inventions are described in the Detailed Description with reference to the Figures. In the Figures, like numerals may reference like elements and descriptions of some elements may not be repeated.

DETAILED DESCRIPTION OF THE INVENTION

Figure 1:
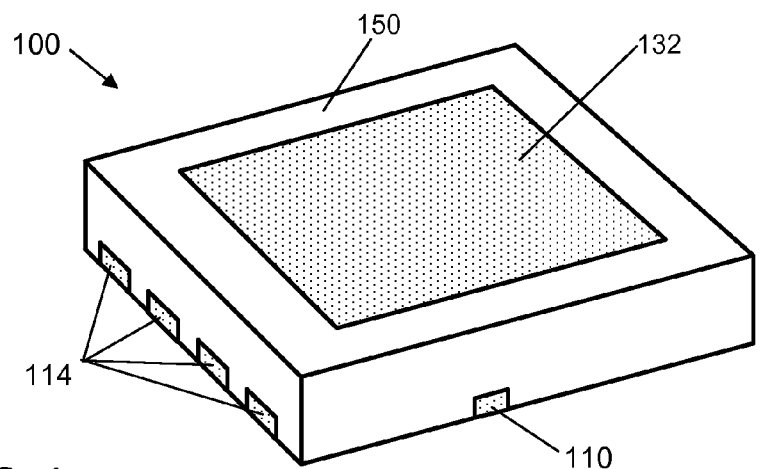
FIG. 1 shows a top perspective view of an exemplary embodiment of a semiconductor die package according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

Figure 2:
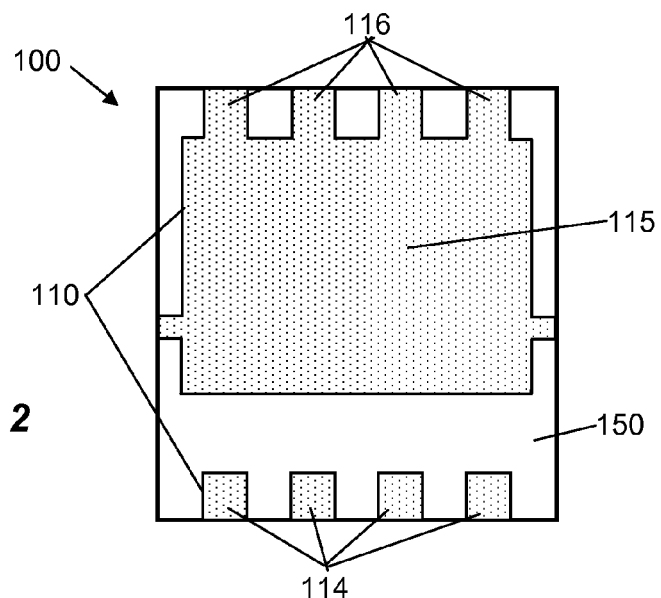
FIG. 2 shows a bottom perspective view of an exemplary embodiment of a semiconductor die package according to the present invention.

FIG. 1 shows a top perspective view of an exemplary embodiment 100 of a semiconductor die package according to the present invention in the form of a Power Quad Flat No-lead package ("PQFN"). Package 100 comprises a leadframe 110 having a first plurality of leads 114, and a body 150 of electrically insulating molding material that encases a semiconductor die and heat sink member, which are described below, in the form of a right parallelepiped with a top surface, bottom surface, and four sides with a thin profile. For this reason, the package is said to be "Quad Flat." Leadframe 110 is disposed at the bottom surface of package 100, and the heat sink member is disposed at the top surface of package 100. A top heat conducting layer 132 of the heat sink member, which may comprise metal, is shown in FIG. 1. Heat conducting layer 132 is electrically insulated from the voltages within the package, and an external heat sink (external to package 100) may be thermally coupled to heat conducting layer 132 without risk of coupling high voltages to the external heat sink. FIG. 2 shows a bottom perspective view of semiconductor die package 100. There, it can be seen that leadframe 110 further comprises a die attach region 115 (e.g., die paddle) and a second plurality of leads 116. Leads 114 and 116 have surfaces that are flush with the bottom and side surfaces of the package, and the leads do not extend beyond the package surfaces (for this reason, the package is said to be "No-lead" in the sense that there are no leads extending beyond the package body). Within package 100, as illustrated below, a semiconductor die is mounted to die attach region 115 and may have a surface electrode electrically coupled to one surface of the die attach region. The other surface of die attach region 115, the one exposed by body 150 of molding material, may be electrically coupled to an interconnect board by a body of electrically conductive adhesive, such as solder. The conductive adhesive, and in particular solder adhesive, also thermally couples die attach region 115 to the interconnect board.

Figure 3:
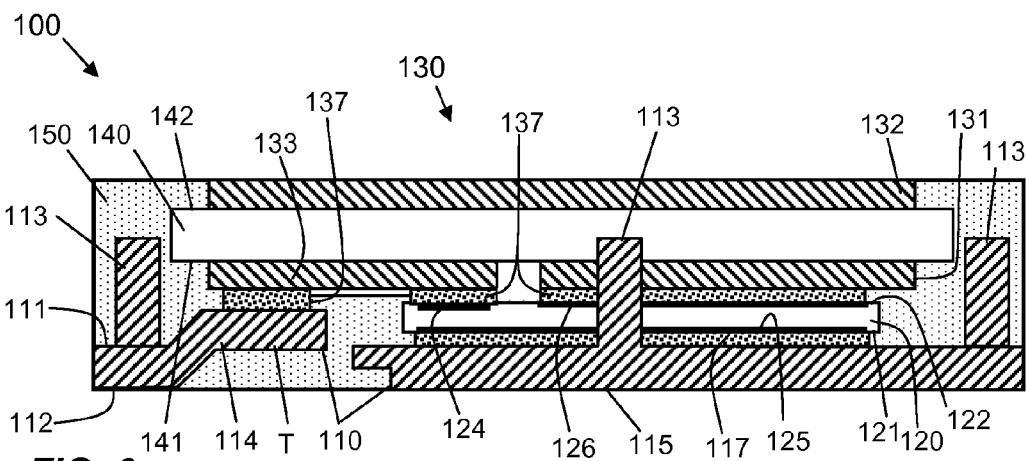
FIG. 3 shows a side view of an exemplary embodiment of a semiconductor die package according to the present invention.

FIG. 3 shows a side view of semiconductor die package 100 with portions of the body 150 of molding material removed. As can be seen, leadframe 110 has a first surface 111, a second surface 112 opposite to first surface 111, die attach region 115, and leads 114 and 116, with leads 116 being electrically coupled to die attach region 115. Package 100 further comprises a semiconductor die 120 having a first surface 121 disposed on die attach region 115 at first surface 111 of the leadframe 110, and a second surface 122 opposite to its first surface 121. Semiconductor device 120 may comprise a vertical power transistor having a first current-conducting electrode 125 (e.g., drain) disposed at its first surface 121, a control electrode 124 (e.g., gate) disposed at its second surface 122, and a second current-conducting electrode 126 (e.g., source) also disposed at its second surface 122. First current-conducting electrode 125 is electrically coupled to die attach region 115 by a body 117 of electrically conductive adhesive, which may comprise solder.

Semiconductor die package 100 further comprises a heat sink member 130 disposed over the second surface 122 of semiconductor die 120. Heat sink member 130 has an electrically insulating substrate 140 with a first surface 141 and a second surface 142, a first electrically conductive layer 131 and a second electrically conducting layer 132 disposed on the substrate's first surface 141, and a heat conducting layer 132 disposed on the substrate's second surface 142. A portion of second conductive layer 133 faces control electrode 124 of semiconductor die 120 and is electrically coupled to it by a body 137 of electrically conductive adhesive, which may comprise solder. Another portion of second electrically conductive layer 133 faces a tab T holding lead 114 and is electrically coupled to it by a body 137 of electrically conductive adhesive. In this manner, electrode 124 is electrically coupled to a lead 114. An adhesive mask layer 135 (e.g., solder mask) may be disposed on electrically conductive layers 131 and 133 at surface 141 of substrate 140 to keep the bodies 137 from flowing together (which would diminish their heights and potentially lessen their conductivity). In a similar manner, a first portion of first electrically conductive layer 131 faces second current conducting electrode 126 of semiconductor die 120 and is electrically coupled to it by a body 137 of electrically conductive adhesive, which may comprise solder. As described below with reference to FIG. 4, a second portion of first conductive layer 131 faces a tab holding other leads and is electrically coupled to it by a body 137 of electrically conductive adhesive.

Figure 4:
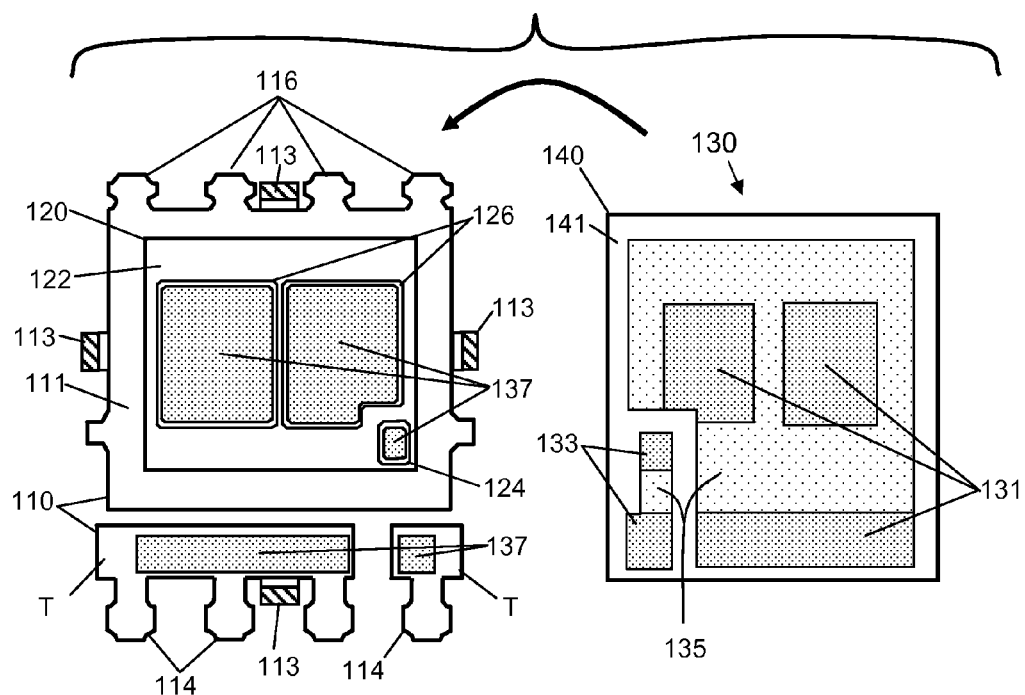
FIG. 4 shows a side-by-side view of components of the exemplary embodiment shown in FIGS. 1-3 prior to assembly according to the present invention.

For a better view of the electrical connections between die 120 and conductive layers 131 and 133, FIG. 4 shows a side-by-side view of the first surface 111 of leadframe 110 with die 120 disposed thereon on the left side of the figure, and heat sink member 130 with first surface 141 of substrate 140 and conductive layers 131 and 133 on the right side of the figure. There, the bodies 137 of conductive adhesive are seen disposed on electrodes 124 and 126 of die 120, and on two tabs T of leadframe 110 that hold the leads 114 (three leads being held by one tab, and another lead being held by another tab). An adhesive mask layer 135 (e.g., a solder mask) is disposed on portions of conductive layers 131 and 133 to limit the flow of adhesive bodies, and prevent them from flowing together. In the assembled package, the first surface 141 of heat sink member 130 is flipped over and onto leadframe 110 and die 120, as indicated by the arrow symbol in the figure. In doing so, the bottommost portion of first electrically conductive layer 131 will face the leftmost tab T of leadframe 110 that holds three leads 114 together, and will be electrically coupled to it by a body 137 of electrically conductive adhesive. Also, two central portions of first electrically conductive layer 131 will face two corresponding portions of electrode 126 of die 120, and will be electrically coupled to it by a body 137 of electrically conductive adhesive. Similar electrical interconnections between portions of second electrical conductive layer 131 with each of electrode 124 of die 120 and the rightmost tab T of leadframe 110 will be made, which will electrically couple electrode 124 to the rightmost lead 114.

To aid in assembling heat sink member 130 with leadframe 110 and die 120, leadframe 110 may further comprise one or more vertical alignment tabs 113, each being disposed along a side of leadframe 110. With heat sink member 130 disposed over die 120 and leadframe 110, tabs 113 only touch the electrically insulating material of substrate 140, thereby preventing electrical shorting between conductive layers 131, 133 and leadframe 110. That is to say, conductive layers 131 and 133 are inset from the edges of substrate 140 in at least the areas that face tabs 113. Vertical tabs 113 may be readily formed by conventional leadframe stamping processes. In an initial stamping step, the material for each tab 113 may be defined from the stock material, along with the other components of the leadframe being defined. In a subsequent stamping step, the distal portion of each tab may be bent in the vertical direction.

Heat conducting layer 132 may comprise a high thermal conductivity metal, such as aluminum (Al), an Al alloy, copper (Cu), or a Cu alloy. Electrically conductive layers 131 and 133 may comprise a good conducting material, such as copper (Cu), which may be coated with a sub-layer of nickel (Ni) or gold (Au) layer to prevent oxidation prior to assembly. Layers 131 and 133 may have a thickness in the range of 1 mil to 4 mils (~25 microns to ~200 microns) or more to support high levels of current to die 120. Substrate 140 preferably has a thickness of 0.5-2.0 mm, a thermal conductivity of at least 1 Watt/meter-Kelvin (W/mK), and a voltage breakdown voltage of at least 50 volts. Substrate 140 typically has a thermal conductivity in the range of 10 W/mK to 100 W/mK, and a breakdown voltage in the range of 100 to 600 volts. In some embodiments, the breakdown voltage is preferably 200 volts or greater, and more preferably 400 volts or greater. Substrate 140 may comprise a composition of one or more ceramic materials, an electrically insulating polymer filled with heat conducting particles (e.g., filled epoxy), a thermally conductive plastic, or a combination of two or more of these. Ceramic materials include metal oxides and metal nitrides. Exemplary metal oxides include $Al_2O_3$ and BeO, and exemplary metal nitrides include AlN and SiN. An electrically insulating polymer filled with heat conducting particles may comprise an epoxy filled with one or more powered ceramic materials. Thermally conductive plastic materials have a thermal conductivity of at least 1 W/mK, and comprise a homogeneous composition of one or more polymer materials, and may have one or more solid filler materials in particulate and/or powdered form, mixed with the polymer(s) in a homogeneous manner. An exemplary thermally conductive material is CoolPoly® of Il Kwang Polymer Co., Ltd. located in GyeongGi-do, Korea. CoolPoly® comprises a liquid crystalline polymer and one or more fillers, and has a homogeneous composition.

Layer 131-133 may be adhered to the surfaces of substrate 140 by any conventional process. Substrate 140 and layers 131-133 may collectively comprise a direct-bonded copper (DBC) substrate, an insulated metal (IMS) substrate, or the like. An exemplary direct bonded copper substrate comprises a sheet of ceramic material, such as alumina, with a sheet of copper bonded to each surface of the ceramic sheet by a high-temperature oxidation process (the copper and substrate are heated to a controlled temperature in an atmosphere of nitrogen containing a small amount of oxygen, around 30 ppm, which forms a copper-oxygen eutectic bonding layer between each copper sheet and the oxides present in the ceramic material). An exemplary insulated metal substrate comprises a metal sheet, such as an aluminum or copper sheet, covered by a layer of dielectric material (typically an epoxy-based material), which in turn is covered by a copper layer. The aluminum or copper sheet may provide heat conducting layer 132, and the copper layer may be patterned to provide electrically conductive layers 131 and 133.

The features of the present invention provide a robust and compact PQFN semiconductor die package, with high thermal performance, excellent voltage isolation for high voltage power applications, and dual cooling paths for the device through the top and bottom surfaces of package. The features further provide for the easy ability of the user to attach an external heat sink to the top surface of the package for additional cooling without the need to use electrically insulating adhesives (which are generally less thermally conductive than metallic solders). Substrate 140, layers 131-132, and a conductive adhesive body 137 provide a high thermally conductive path from semiconductor die 120 to the top surface of the package, while providing excellent dielectric breakdown strength and high voltage isolation for meeting safety requires for high voltage power devices. They also interconnect electrodes 124 and 126 of die 120 to a bank of leads 114 via additional conductive adhesive body 137 and a leadframe tabs T. Heat conducting layer 132, which preferably comprises one or more metals, provides high thermal conductivity and high connection ability to the external heat sink for additional heat dissipation capability. Leadframe 110 and electrically insulating material 150 provide the packages with a Power Quad Flat No-lead package ("PQFN") format for easy mounting to an interconnect substrate. Tabs 113 of leadframe 110 help position heat sink member 130 over die 120 and leadframe 110 during assembly, which may be done by various automated manufacturing machines.

It may be appreciated that more than one die may be assembled to the first surface 112 of leadframe 110, with their top surface interconnected with leads 114 by way of patterns formed in conductive layer 131. Unlike standard packages that only use leadframes, conductive layer 131 can be flexibly patterned (i.e., can be readily adapted) to follow the layout of electrodes on the one or more semiconductor die assembled on leadframe 110, and can be further patterned to provide interconnects between two or more die, and also to leads 114. In these examples, and the examples provided above, adhesive mask 135 can be patterned and used to prevent unexpected extensions of solder or adhesive between patterns of layer 131.

Figure 5:
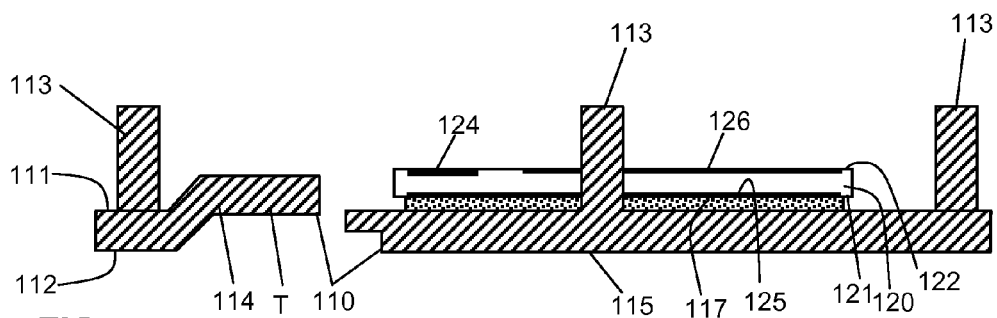
FIGS. 5-12 show cross sectional views of an exemplary semiconductor die during manufacturing by an exemplary method according to the first invention of the present application.
Figure 6:
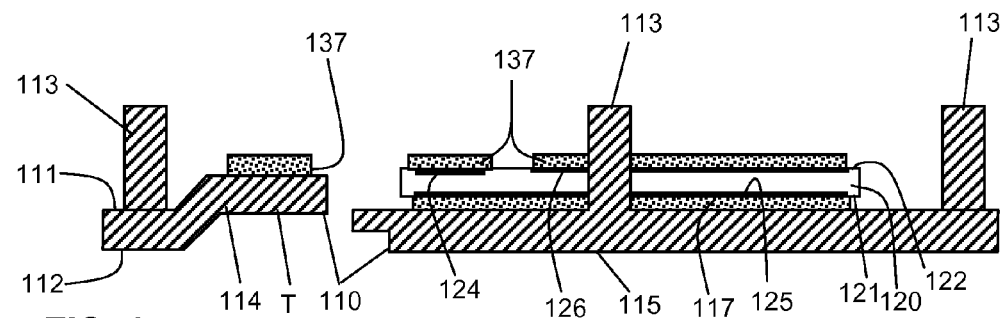
Figure 7:
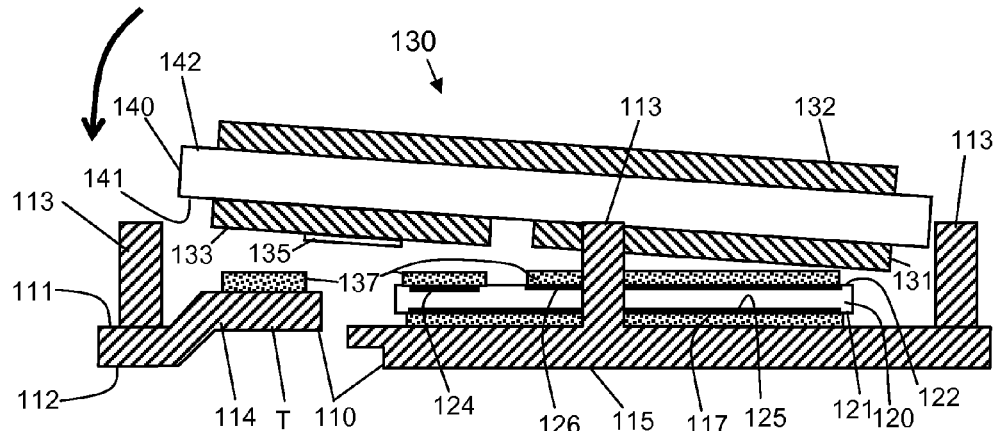
Figure 8:
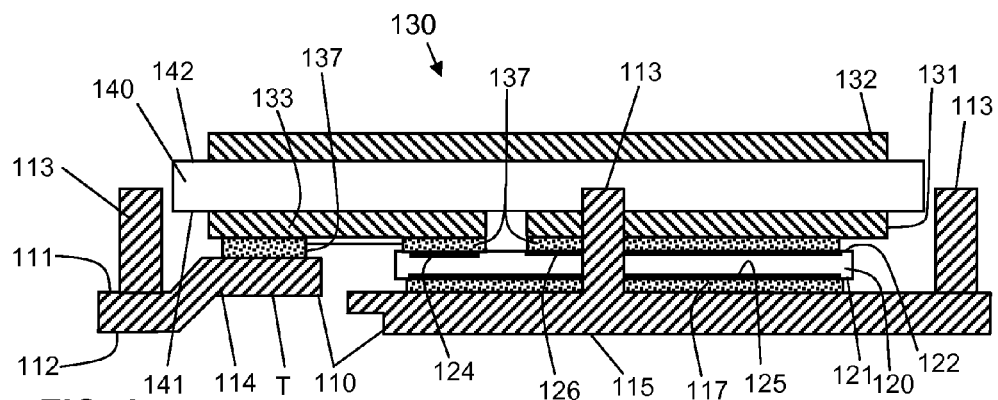

Exemplary methods of manufacturing an exemplary semiconductor die package 100 are illustrated with reference to FIGS. 5-11. Referring to FIG. 5, leadframe 110 and semiconductor die 120 may be assembled together. A body 117 of conductive adhesive, such as solder paste, may be disposed on die attach region 115 and/or electrode 125 of die 120, and semiconductor die 120 may be disposed on the die attach region 115 with its first surface 121 facing die attach region 115. Next, bodies 137 of conductive adhesive may be disposed on electrodes 124 and 126 of die 120, as shown in FIG. 6. Thereafter, heat sink member 130 may be disposed on die 120 and tabs T of leadframe 110, as illustrated in FIG. 7. Conventional pick and place equipment may be used. If vertical tabs 113 are present, they may be used by the equipment to align the placement heat sink member 130 to leadframe 110. Next, in the case where bodies 117 and 137 of conductive adhesive comprise solder, the assembly is exposed to a reflow process, which causes bodies 117 and 137 to reflow and bond to die paddle 115, electrodes 124-126, and conductive layers 131 and 133. In the case where bodies 117 and 137 of conductive adhesive comprise a conductive polymer, such as a solder-filled epoxy (which can be used for low power applications), the bodies 117 and 137 are cured, such as by chemical reaction, exposure to ultraviolet light, and/or exposure to heat. Tabs 113 maintain heat sink member 130 in place during the above treatment processes for bodies 117 and 137. The resulting assembly is shown in FIG. 8.

Figure 9:
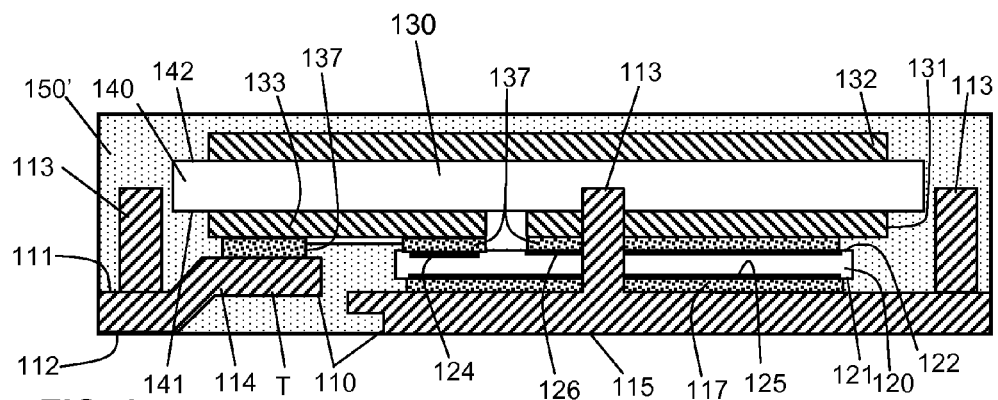

Referring to FIG. 9, body 150 of electrically insulating material may next be disposed over heat sink member 130 and around the sides thereof, over tabs 113 and the other exposed portions of leadframe 110, and around the sides of semiconductor die 120 and conductive adhesive bodies 117 and 137. The result of the molding process is a rough package body 150', which extends above heat conductive surface 132 of heat sink member 130. Body 150' of electrically insulating material is adhered to portions of both surfaces of substrate 140 of heat sink member 130. A simple molding operation may be used to form rough package body 150'. The back surface of leadframe 110 is preferably left exposed to facilitate heat conduction to a substrate to which the finished package is to be attached. Prior to the molding process, a thin backing sheet may be adhered to the second surface 112 of leadframe 110 to keep the molding material from covering the bottom surfaces of die attach region 115 and leads 114 and 116. Other well-known techniques may be also used to prevent the molding material from covering these areas. Next, the top surface of rough package body 150' is planed down to expose heat conducting layer 132. Laser ablation or other milling processes may be used. For example, the DFS8910 surface planer manufactured by DISCO Corporation may be used. The result of this processing is shown in FIG. 3.

Figure 10:
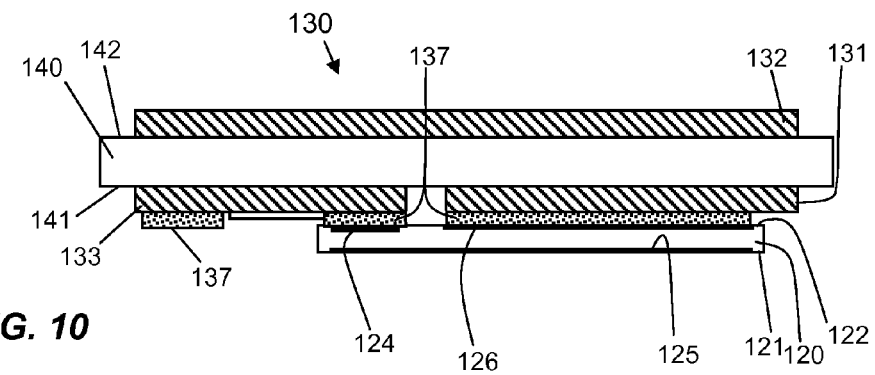
Figure 11:
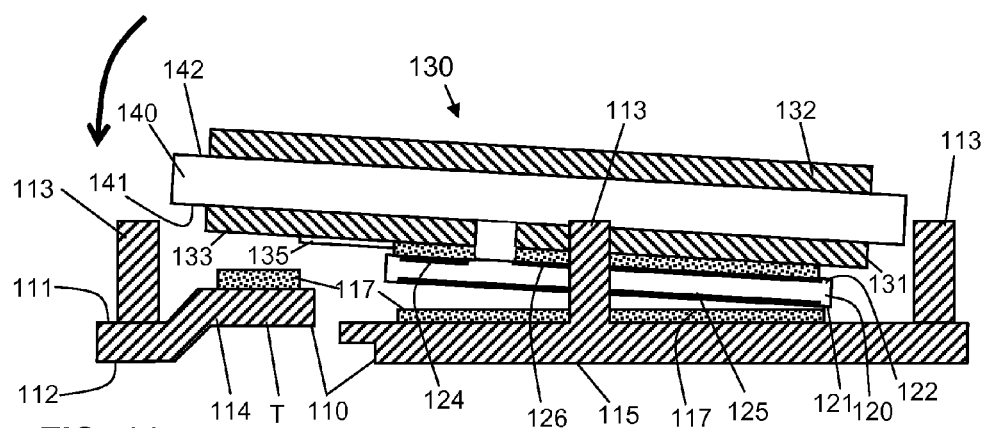

Another exemplary method is described with reference to FIGS. 10-11 and 8-9. Referring to FIG. 10, semiconductor die 120 and heat sink member 130 may be assembled together. Conventional pick and place equipment may be used. Prior to assembly, bodies 137 of conductive adhesive may be disposed on portions of 131 and 133 that will be coupled to electrodes 124 and 126 of die 120, and to tabs T of leadframe 110. Thereafter, a body 117 of conductive adhesive, such as solder paste, may be disposed on die attach region 115, and the assembly of semiconductor die 120 and heat sink member 130 may be disposed on die attach region 115 and tabs T of leadframe 110, as illustrated in FIG. 11. Conventional pick and place equipment may be used. If vertical tabs 113 are present, they may be used by the equipment to align the placement heat sink member 130 to leadframe 110. Next, in the case where bodies 117 and 137 of conductive adhesive comprise solder, the assembly is exposed to a reflow process, which causes bodies 117 and 137 to reflow and bond to die paddle 115, electrodes 124-126, and conductive layers 131 and 133. In the case where bodies 117 and 137 of conductive adhesive comprise a conductive polymer, such as a solder-filled epoxy (which can be used for low power applications), the bodies 117 and 137 are cured, such as by chemical reaction, exposure to ultraviolet light, and/or exposure to heat. The resulting assembly is substantially the same as shown in FIG. 8.

Then, similar to the previously described exemplary method, body 150 of electrically insulating material may next be disposed over heat sink member 130 and around the sides thereof, over tabs 113 and the other exposed portions of leadframe 110, and around the sides of semiconductor die 120 and conductive adhesive bodies 117 and 137. The result of the molding process is a rough package body 150', which extends above heat conductive surface 132 of heat sink member 130, as shown in FIG. 9. Also, similar to the previously described exemplary method, the top surface of rough package body 150' may be planed down to expose heat conducting layer 132, as shown in FIG. 10. As before, laser ablation or other milling processes may be used.

It should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Figure 12:
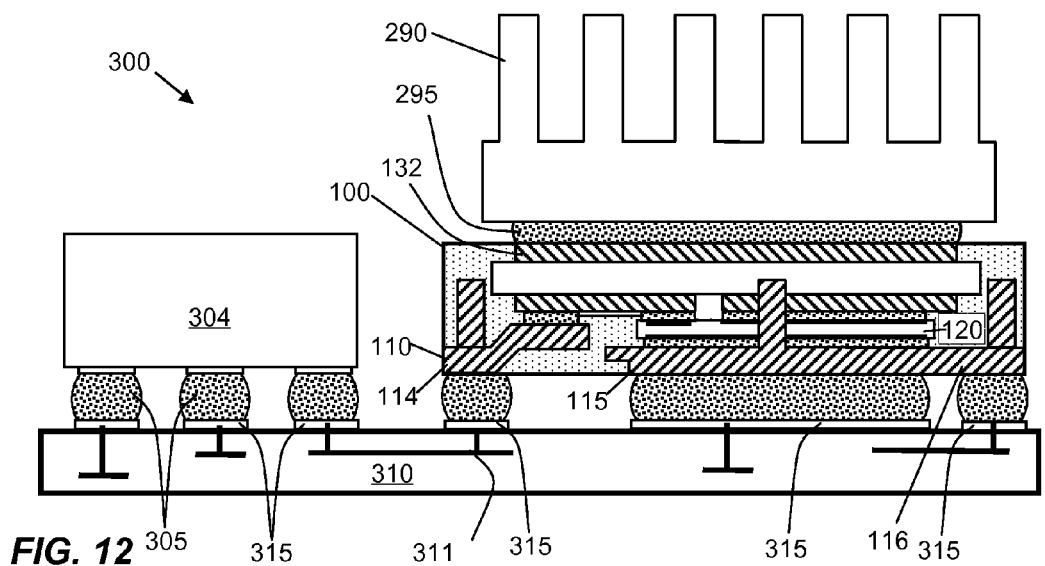

FIG. 12 is a side view of an exemplary system 300 that comprises an interconnect substrate 310 having a plurality of electrical interconnect pads 315, and package 100 disposed on the top surface interconnect substrate 310. The leads 114 and 116 and die attach region 115 of package 100 are electrically coupled to respective pads 315. System 300 also comprises an electrical package 304 that is electrically coupled to respective pads 315 of interconnect substrate 310 by respective adhesive bodies 305. Package 304 may be electrically coupled to package 100 by one or more electrical traces 311 disposed in or on interconnect substrate 310. A heat sink 290 may be attached to package 100 at heat conducting layer 132 by a layer of thermally conductive adhesive 295.

The semiconductor die packages described above can be used in electrical assemblies including circuit boards with the packages mounted thereon. They may also be used in systems such as power controllers, power supplies, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package, comprising:
    a leadframe having a first surface, a second surface opposite to its first surface, a die attach region, a first tab disposed adjacent the die attach region, and at least one lead electrically coupled to the first tab;
    a semiconductor die having a first surface disposed on the die attach region at the first surface of the leadframe and a second surface opposite to its first surface, a first electrode disposed on the die's first surface and electrically coupled to the die attach region, and a second electrode disposed on the die's second surface;
    a heat sink member disposed over the second surface of the semiconductor die and the first tab of the leadframe, the heat sink member having an electrically insulating substrate with a first surface and a second surface, a first electrically conductive layer disposed on the substrate's first surface, and a heat conducting layer disposed on the substrate's second surface, the first electrically conductive layer having a first portion electrically coupled to the die's second electrode by a first body of electrically conductive adhesive and a second portion electrically coupled to the leadframe's first tab by a second body of electrically conductive adhesive; and
    a body of electrically insulating material disposed between the heat sink member and the leadframe and adhered to the heat sink member and the leadframe.

2. The semiconductor die package of claim 1, wherein the body of electrically insulating material is adhered to portions of both surfaces of the substrate of the heat sink member.

3. The semiconductor die package of claim 1, wherein the semiconductor die further has a third electrode disposed on the die's second surface,
    wherein the leadframe further has a second tab, and
    wherein the heat sink member further has a second electrically conductive layer disposed on the first surface of the electrically-insulating substrate, the second electrically conductive layer having a first portion that faces the die's third electrode and that is electrically coupled to it by a third body of electrically conductive adhesive, and a second portion that faces the second tab and that is electrically coupled to it by a fourth body of electrically conductive adhesive.

4. The semiconductor die package of claim 3, further comprising an adhesive mask layer disposed on portions of the first and second electrically conductive layers.

5. The semiconductor die package of claim 1, further comprising an adhesive mask layer disposed on at least a portion of the first electrically conductive layer.

6. The semiconductor die package of claim 1, wherein the leadframe further has a plurality of alignment tabs, each alignment tab being disposed along a side of the leadframe and extending away from the first surface of the leadframe toward the heat sink member.

7. The semiconductor die package of claim 1, wherein the first electrically conductive layer is inset from the edges of the electrically insulating substrate.

8. The semiconductor die package of claim 1, wherein the heat conducting layer comprises one or more of the following: aluminum, an aluminum alloy, copper, a copper alloy.

9. The semiconductor die package of claim 1, wherein the first electrically conductive layer comprises copper.

10. The semiconductor die package of claim 1, wherein the electrically insulating substrate has a thickness in the range of 0.5 mm to 2 mm.

11. The semiconductor die package of claim 1, wherein the electrically insulating substrate has a thermal conductivity of at least 1 Watt/meter-Kelvin (W/mK).

12. The semiconductor die package of claim 1, wherein the electrically insulating substrate has a thermal conductivity of at least 10 W/mK.

13. The semiconductor die package of claim 1, wherein the electrically insulating substrate has a voltage breakdown voltage of at least 50 volts.

14. The semiconductor die package of claim 1, wherein the electrically insulating substrate has a voltage breakdown voltage of at least 100 volts.

15. The semiconductor die package of claim 1, wherein the electrically insulating substrate comprises one or more ceramic materials.

16. The semiconductor die package of claim 1, wherein the electrically insulating substrate comprises an electrically insulating polymer filled with heat conducting particles.

17. The semiconductor die package of claim 1, wherein the electrically insulating substrate comprises a thermally conductive plastic.

18. The semiconductor die package of claim 1, wherein the heat sink member comprises a direct-bonded copper substrate or an insulated metal substrate.

19. The semiconductor die package of claim 1, wherein the package has a rectangular parallelepiped shape, and wherein the leads do not extend beyond the package.

20. A system comprising an interconnect substrate and the semiconductor die package of claim 1 attached to the interconnect substrate.

21. A method of manufacturing a semiconductor die package, the method of comprising:
    assembling a leadframe, at least one semiconductor die, and a heat sink member together, the leadframe having a first surface, a second surface opposite to its first surface, a die attach region, a tab disposed adjacent the die attach region, and at least one lead electrically coupled to the tab, the at least one semiconductor die having a first surface, a second surface opposite to its first surface, a first electrode disposed on the die's first surface, and a second electrode disposed on the die's second surface, the die's first surface being disposed on the leadframe's die attach region with the die's first electrode being electrically coupled to the die attach region by a body of electrically conductive adhesive, the heat sink member having an electrically insulating substrate with a first surface and a second surface, an electrically conductive layer disposed on the substrate's first surface, and a heat conducting layer disposed on the substrate's second surface, the heat sink member being disposed over the second surface of the semiconductor die and the tab of the leadframe with the electrically conductive layer having a first portion electrically coupled to the die's second electrode and a second portion electrically coupled to the leadframe's tab; and disposing a body of electrically insulating material disposed between the heat sink member and the leadframe and adhered to the heat sink member and the leadframe.

22. The method of claim 21, wherein assembling a leadframe, at least one semiconductor die, and a heat sink member together comprises assembling the semiconductor die and leadframe together, followed by assembling the heat sink member onto the semiconductor die and leadframe.

23. The method of claim 21, wherein assembling a leadframe, at least one semiconductor die, and a heat sink member together comprises assembling the semiconductor die and heat sink member together, followed by assembling the heat sink member and semiconductor die onto the leadframe.

24. The method of claim 21, wherein the bodies of electrically conductive adhesive comprise solder, and wherein assembling a leadframe, at least one semiconductor die, and a heat sink member together comprises reflowing the solder.

* * * * *